US009273995B2

(12) United States Patent
Godfrey et al.

(10) Patent No.: US 9,273,995 B2
(45) Date of Patent: Mar. 1, 2016

(54) LIGHT EMITTING DIODE OUTPUT POWER CONTROL

(71) Applicant: Excelitas Canada, Inc., Vaudreuil-Dorion (CA)

(72) Inventors: Lawrence Godfrey, Vaudreuil-Dorion (CA); Arthur Barlow, Alton (GB)

(73) Assignee: Excelitas Technologies Philippines, Inc., Cabuyao (PH)

( * ) Notice: Subject to any disclaimer, the term of this patent is extended or adjusted under 35 U.S.C. 154(b) by 93 days.

(21) Appl. No.: 14/172,275

(22) Filed: Feb. 4, 2014

(65) Prior Publication Data

US 2015/0219490 A1  Aug. 6, 2015

(51) Int. Cl.
| H05B 37/00 | (2006.01) |
| H05B 39/00 | (2006.01) |
| H05B 41/00 | (2006.01) |
| G01J 1/42 | (2006.01) |
| H01L 25/16 | (2006.01) |

(52) U.S. Cl.
CPC .......... *G01J 1/42* (2013.01); *H01L 25/167* (2013.01); *H01L 2224/48091* (2013.01); *H01L 2224/48247* (2013.01); *H01L 2933/0033* (2013.01)

(58) Field of Classification Search
USPC ................ 315/185, 36, 256; 314/8
See application file for complete search history.

(56) References Cited

U.S. PATENT DOCUMENTS

| 5,724,055 | A | 3/1998 | Omae | |
| 5,828,172 | A | 10/1998 | Berthold et al. | |
| 7,170,234 | B2 * | 1/2007 | Chikugawa | H05B 33/0818 |
| | | | | 315/209 R |
| 7,626,346 | B2 * | 12/2009 | Scilla | H05B 33/0854 |
| | | | | 315/224 |
| 8,405,318 | B2 | 3/2013 | Hatakenaka et al. | |
| 8,575,630 | B2 * | 11/2013 | Ito | H01L 25/167 |
| | | | | 257/88 |
| 8,680,782 | B2 * | 3/2014 | Sakuragi | H05B 33/083 |
| | | | | 315/185 S |
| 8,896,207 | B2 * | 11/2014 | Thomas | H05B 33/0809 |
| | | | | 315/185 R |

(Continued)

FOREIGN PATENT DOCUMENTS

| EP | 0493015 B1 | 6/1996 |
| JP | 2005310996 | 11/2005 |

(Continued)

OTHER PUBLICATIONS

STMicroelectronics, TN0026, Technical note, LED balancing circuits, Apr. 2007.

(Continued)

*Primary Examiner* — Adam Houston
(74) *Attorney, Agent, or Firm* — Peter A. Nieves; Sheehan Phinney Bass & Green PA

(57) ABSTRACT

A method of reducing variation in optical power levels across a group of light emitting diodes includes testing each respective one of the light emitting diodes to determine an optical power level produced by that light emitting diode when connected to an electrical power source. During testing, the electrical power source delivers a substantially identical amount of electrical current to each respective one of the light emitting diodes. The optical power levels from the test all fall within a first range of values. The method includes connecting an electrical resistance in parallel with at least some of the light emitting diodes to reduce an amount of optical power produced by those light emitting diodes. After the electrical resistances are connected, all of the optical power levels produced by the light emitting diodes fall within a second range that is narrower than the first range.

20 Claims, 9 Drawing Sheets

(56) References Cited

U.S. PATENT DOCUMENTS

| | | | |
|---|---|---|---|
| 9,035,567 B2* | 5/2015 | Sakuragi | H05B 33/0809 315/185 S |
| 2005/0168156 A1* | 8/2005 | Li | H05B 33/0803 315/185 R |
| 2006/0220586 A1* | 10/2006 | Latham | H05B 33/0854 315/185 S |
| 2008/0157687 A1* | 7/2008 | Lin | H05B 33/0851 315/185 S |
| 2010/0309649 A1 | 12/2010 | Hsu | |
| 2015/0219490 A1* | 8/2015 | Godfrey | G01J 1/42 250/206 |

FOREIGN PATENT DOCUMENTS

| | | |
|---|---|---|
| JP | 2006237409 | 9/2006 |
| WO | 2011110981 A2 | 9/2011 |

OTHER PUBLICATIONS

Mudassar Khatib Ballast Resistor Calculation—Current Matching in Parallel, Texas Instruments Application Report, SLVA325—Apr. 2009.

European Search Report for EP 15153177.9 dated Jul. 7, 2015.

* cited by examiner

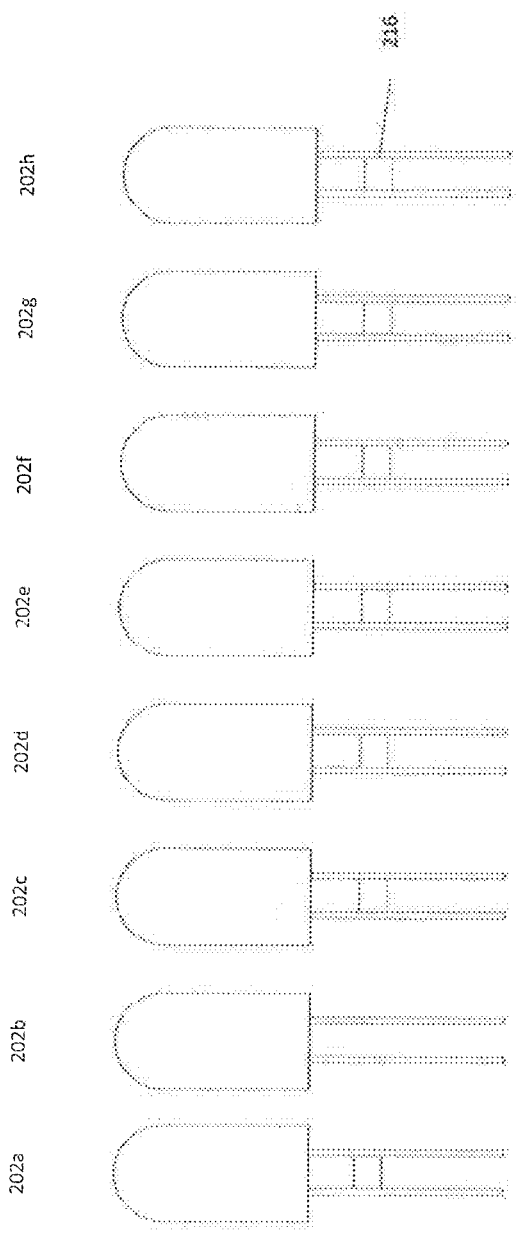
FIG. 2C1
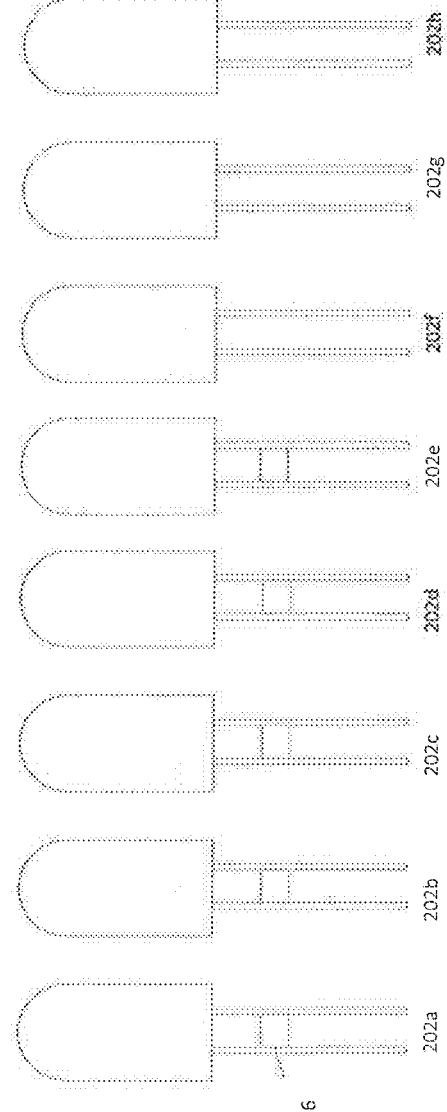
FIG. 2C2

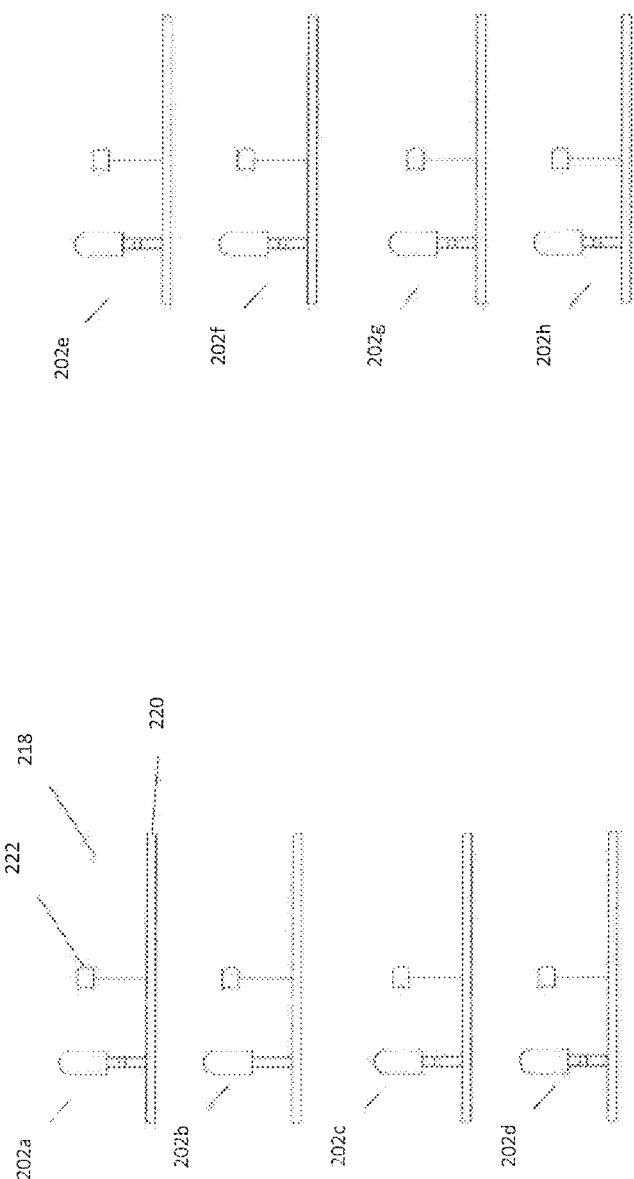

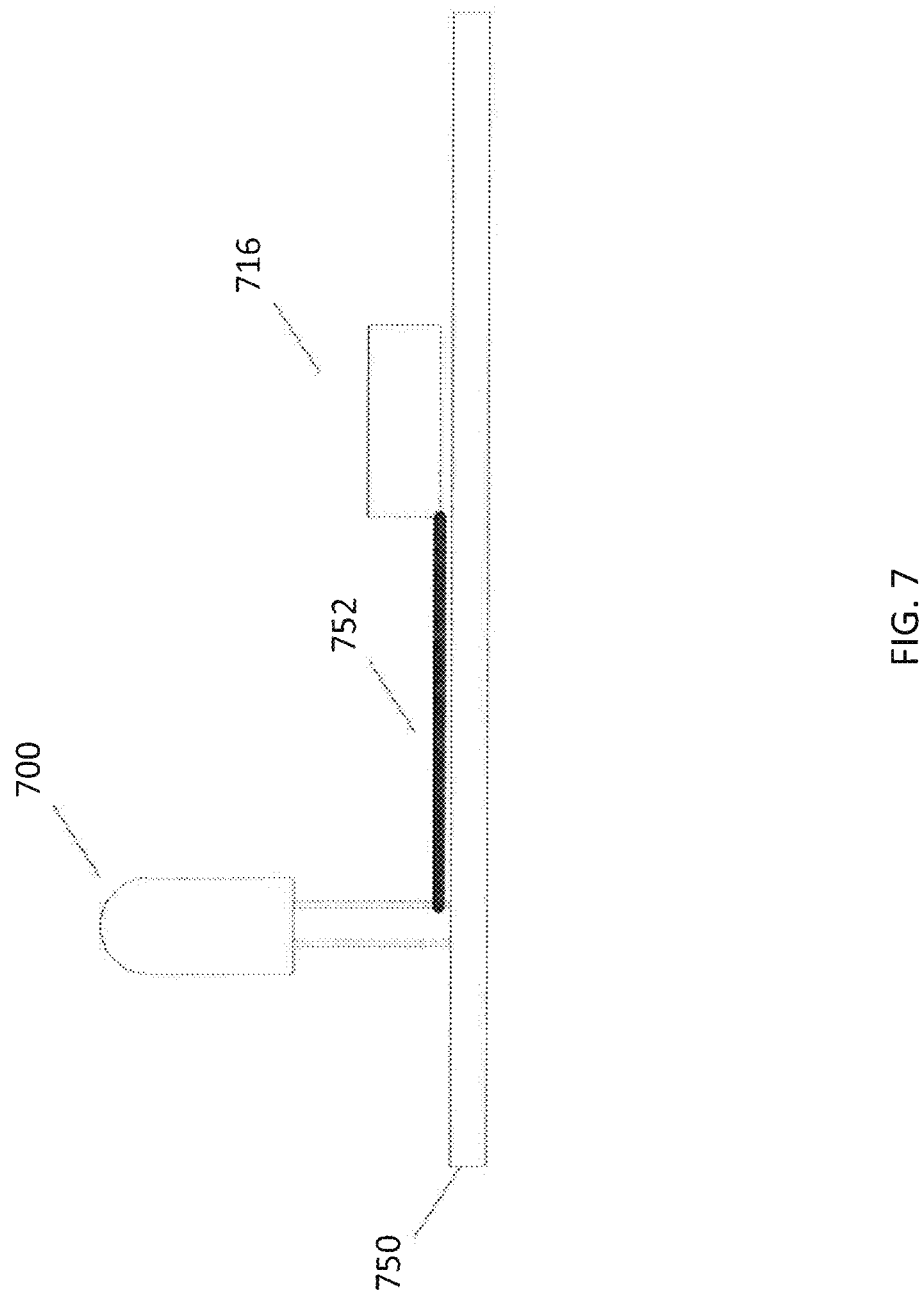

LIGHT EMITTING DIODE OUTPUT POWER CONTROL

FIELD OF THE INVENTION

The present disclosure relates to light emitting diodes and, more particularly, relates to output power control of light emitting diodes.

BACKGROUND

Light emitting diodes having similar designs can sometimes produce very different optical power output levels. Typically, circuits that drive these light emitting diodes do so by providing constant or substantially constant electrical current (D.C. or pulsed) to the light emitting diodes.

SUMMARY OF THE INVENTION

In one aspect, a method is disclosed that reduces the degree of variation in a group of light emitting diodes. In a typical implementation, the method includes providing a group of discrete light emitting diodes and testing each respective one of the light emitting diodes in the group to determine an optical power level produced by that light emitting diode when connected to an electrical power source. During testing, the electrical power source delivers a substantially identical amount of electrical current to each respective one of the light emitting diodes. The optical power level produced by the light emitting diodes during the test all fall within a first range of values. The method further includes connecting an electrical resistance in parallel with at least some of the light emitting diodes in the group to reduce an amount of optical power produced by those light emitting diodes. After the electrical resistances are connected, all of the optical power levels produced by the light emitting diodes fall within a second range that is narrower than the first range.

In some implementations, one or more of the following advantages are present.

For example, in some implementations, the techniques described herein reduce variations in optical power produced by different light emitting diodes in a group of similar or substantially similar light emitting diodes in a relatively simple and cost-efficient manner. This may help avoid the complexities, inefficiencies, time-consuming nature and tediousness of designing optical detectors and/or related circuitry to be able to accommodate wide variations in optical power levels, or binning light emitting diodes to categorize them according to the actual optical power each one produces. Moreover, implementing these techniques may help avoid the situation where it is not effective and/or possible to meet system design goals if the full distribution of light emitting diode output powers is used, thereby, resulting in the scrapping of some part of the distribution.

Other features and advantages will be apparent from the description and drawings, and from the claims.

BRIEF DESCRIPTION OF THE DRAWINGS

FIG. 2C1 and FIG. 2C2 are front views showing an exemplary group of discrete light emitting diodes, some of which have a parallel connected electrical resistance.

FIG. 2D is a schematic representation showing the light emitting diodes from FIG. 2C1 installed in respective optical detector assemblies.

FIG. 7 is a schematic diagram showing a light emitting diode and a parallel electrical resistance coupled to a substrate.

Like reference characters refer to like elements.

DETAILED DESCRIPTION

Commercially available light emitting diodes that are similar or substantially identical in design (e.g., those that are intended to be used in the same or substantially the same end applications) can sometimes produce widely varying optical power levels.

In some instances, the variation in optical power produced by different light emitting diodes having a particular type of design can be up to 300%. This relatively wide variation can lead to a variety of problems unless measures are taken to address the variation. Some of these measures may include, for example, designing optical detectors and/or related circuitry to be able to accommodate the wide variation in optical power levels, or binning light emitting diodes to categorize them according to the actual optical power each one produces. These approaches are less than ideal. For example, having to design optical detectors and/or related circuitry to accommodate wide variations in optical power from light emitting diode to light emitting diode can be complex, inefficient and very costly. Likewise, binning light emitting diodes according to optical power produces can be tedious, time consuming and very costly as well.

Figure 1:
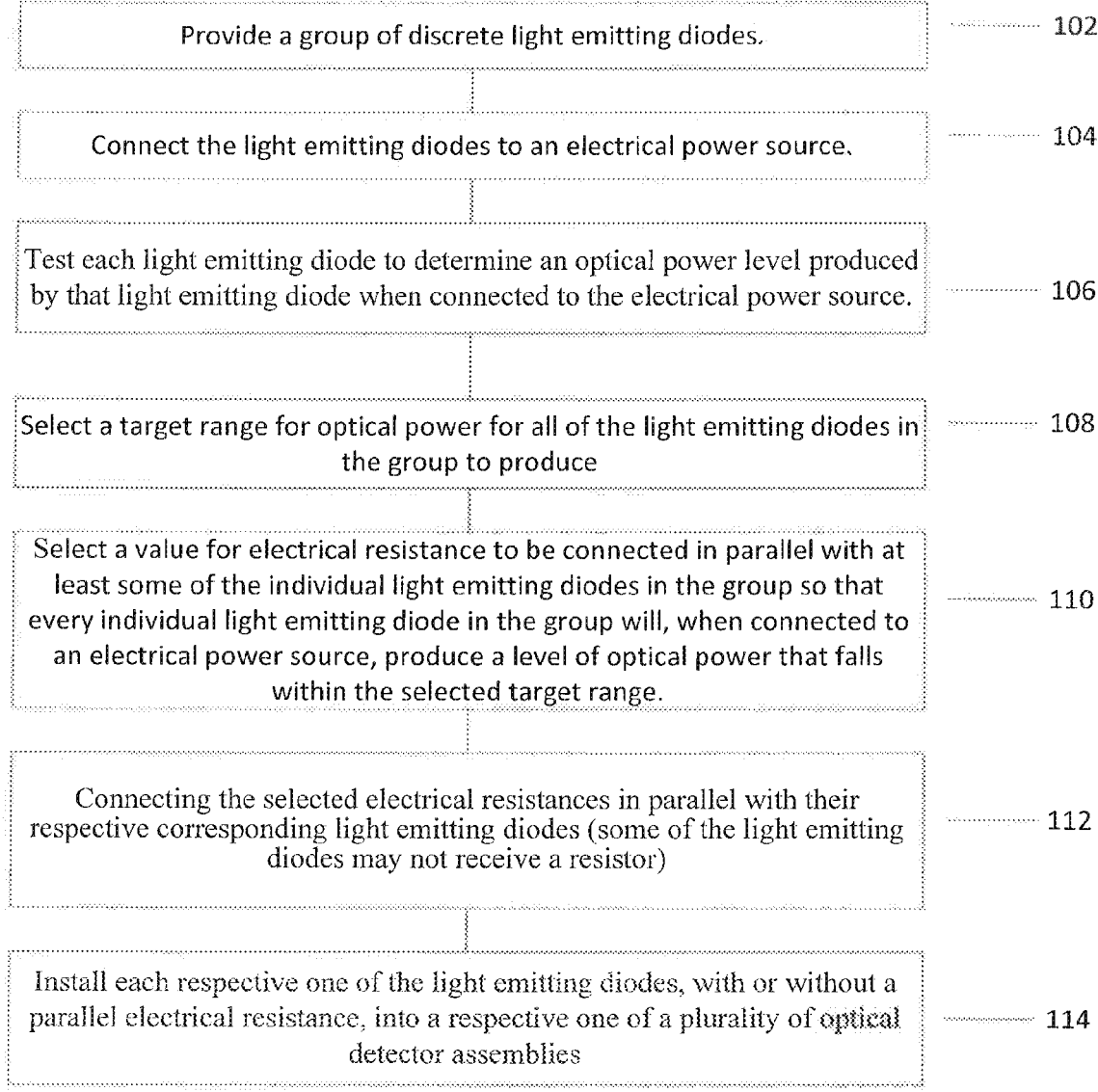
FIG. 1 is a flowchart of a method to reduce variation in optical power in a group of discrete light emitting diodes.

FIG. 1 is a flowchart that shows a manufacturing process to deal with wide variations in optical power produced by different light emitting diodes having a similar or substantially similar design in a relatively simple and cost-efficient manner.

At a very high-level, the illustrated method includes: 1) determining how much optical power each respective light emitting diode in a group of light emitting diodes produces when it is connected to a constant current electrical power source, where all of the optical power levels fall within a first range, and 2) connecting an electrical resistance in parallel with one or more (or some) of the light emitting diodes in the group to reduce the optical power they produce so that, after the electrical resistances are in place, all of the light emitting diodes produce an optical power level when connected to the constant current electrical power source that falls within a second range that is narrower than the first range.

According to the flowchart, the method includes (at 102) providing a group of discrete light emitting diodes. The light emitting diodes provided (at step 102) can be, but need not be, completed light emitting diode assemblies. For example, in some implementations, the light emitting diodes provided (at step 102) may not yet have an epoxy lens/case in place around the light emitting element(s). However, the light emitting diodes provided (at step 102) should be at least functional (i.e., they should be able to illuminate when connected to an electrical power source). In some implementations, of course, the light emitting diodes provided (at step 102) may include all of the components that normally would be associated with a light emitting diode including, for example, anode and cathode leads, one or more internal semiconductor dice, internal wire bonds, one or more optical components, and a lens/case that covers all of the components except for part of the anode and cathode leads. In various implementations, the lens/case can be epoxy, metallic and/or other material(s) or combinations thereof.

"Providing" the light emitting diodes can include any way of making the light emitting diodes available for use in connection with subsequent steps represented in the illustrated method. This may include, for example, purchasing or otherwise obtaining the light emitting diodes, manufacturing the light emitting diodes, assembling or partially assembling the components of the light emitting diodes, or otherwise supplying the light emitting diodes.

Figure 2A:
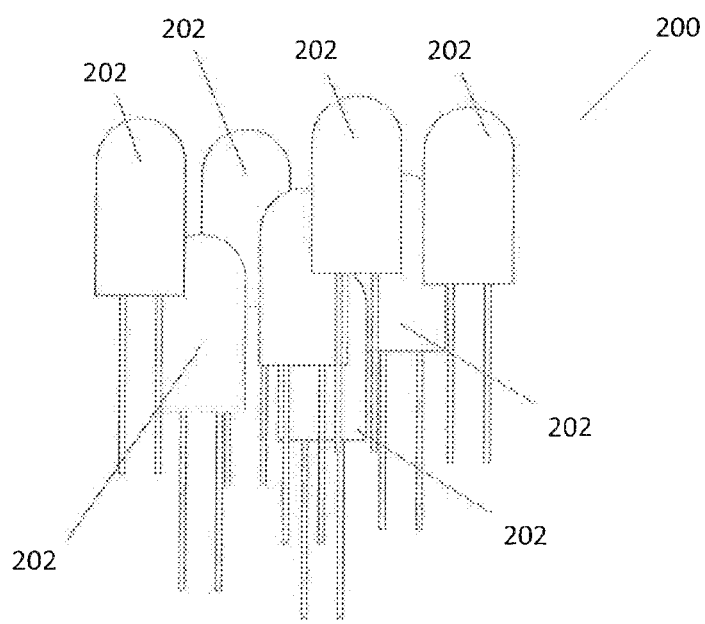
FIG. 2A is a front view showing an exemplary group of discrete light emitting diodes.

FIG. 2A shows an example of a group 200 of discrete light emitting diodes 202a-202h that may be provided in step 102 of FIG. 1.

The light emitting diodes 202a-202h in the illustrated group are essentially completed light emitting diode structures (i.e., each light emitting diode has all of the components that normally are associated with a light emitting diode including, for example, anode and cathode leads, one or more internal semiconductor dice, internal wire bonds, one or more optical components, and an epoxy lens/case that covers all of the components except for part of the anode and cathode leads).

The light emitting diodes 202a-202h in the illustrated group 200 all have the same or substantially the same design. Therefore, all of the light emitting diodes 202a-202h in the group 200 would be considered intended for use (or able to be used) in connection with the same type of end application (e.g., for use in a smoke detector).

For illustrative purposes only, the group 200 shown has only eight light emitting diodes 202a-202h. However, in a typical implementation, a particular group of light emitting diodes can include any number of light emitting diodes including, for example, up to a million or more light emitting diodes.

Notably, each light emitting diode 202a-202h in the illustrated group is a discrete component (i.e., it has not yet been connected to any other devices, components, etc.). This is typically how the light emitting diodes would be provided (at step 102 in FIG. 1). However, in some implementations, the light emitting diodes could be connected to some other device or component when it is provided (at step 102).

Referring again to FIG. 1, the illustrated method includes connecting the light emitting diodes to an electrical power source (at 104) and testing each light emitting diode to determine an optical power level produced by that light emitting diode when connected to the electrical power source (at 106). The electrical power source can be any kind of electrical power source. For example, the electrical power source can be a constant current electrical power source. Alternatively, the electrical power source can be a voltage source, as long as the amount of current being delivered to the light emitting diode being tested can be determined. The light emitting diodes may be connected to the electrical power source and tested in a variety of ways.

Figure 2B:
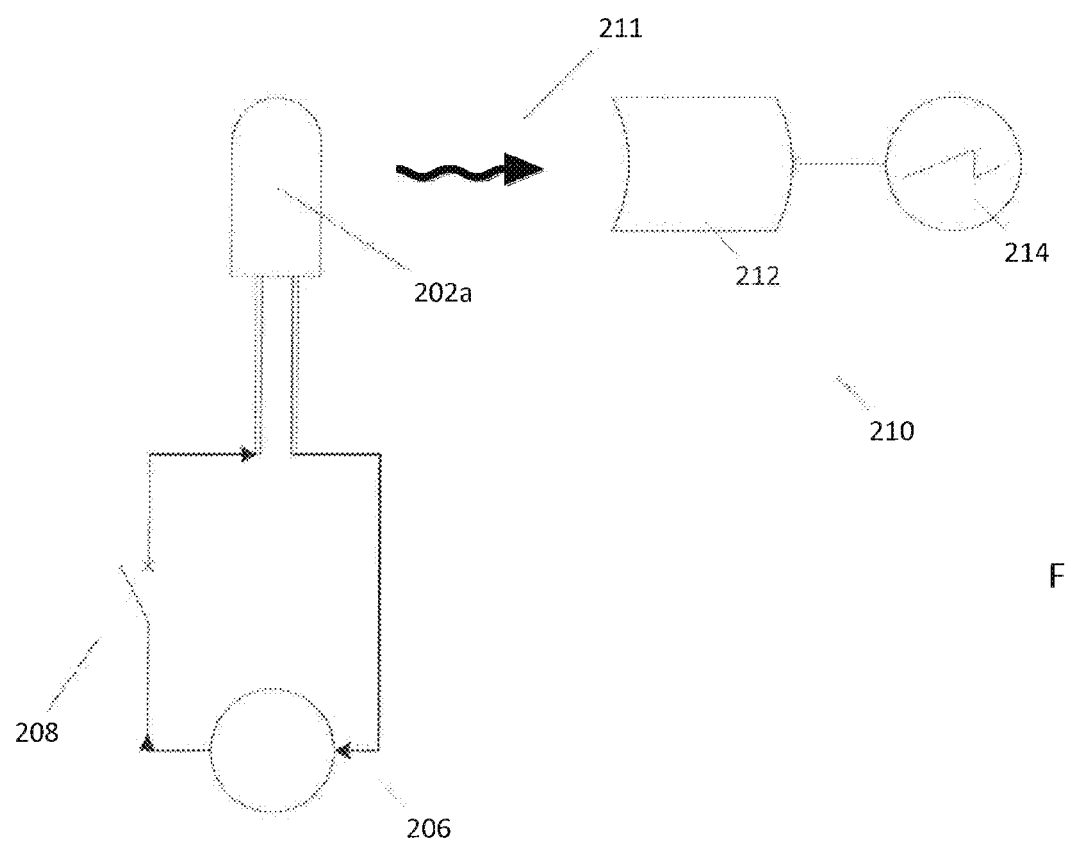
FIG. 2B is a schematic representation showing an arrangement for testing optical power produced by a light emitting diode.

FIG. 2B shows one example of an arrangement for connecting a light emitting diode to an electrical power source for testing the amount of optical power it produces. In the illustrated implementation, a single one of the light emitting diodes 202a is electrically connected to a circuit that includes an electrical power source 206 and a switch 208, which may be considered optional. No other circuit components are included in the illustrated arrangement. However, in some implementations, other circuit components (e.g., an electrical current meter or a voltmeter connected across the light emitting diode) may be included in the circuit as well.

The light emitting diode 202a is physically positioned near an optical detector 210 so that at least some of the light 211 emitted by the light emitting diode lands on the optical detector 210. The optical detector 210 can be any kind of optical detector that is able to detect and provide an indication of the optical power being produced by the light emitting diode 202a. The illustrated optical detector 210 has a detecting portion 212 and a display portion 214. Functionally, the detecting portion 212 detects the optical power and the display portion 214 provides an indication of the detected optical power. The detecting portion 212 can based on any kind of optical detecting technology including, for example, photodiode detector technology. The display portion 214 can be based on any kind of display technology including, for example, analog or digital display technology.

The electrical power source 206 may be any type of electrical power source (e.g., constant current or constant voltage). In the illustrated example, the electrical power source 206 is a constant current electrical power source. The constant current electrical power source is generally operable to produce a direct electrical current that is substantially constant over time. In order to maintain the electrical current at a constant or substantially constant level, the constant current electrical power source may be operable to vary the amount of voltage it produces.

In use, the switch 208 can be closed to electrically connect the light emitting diode 202a to the electrical power source 206 to thereby energize the light emitting diode 202a. The optical power of the light produced by the light emitting diode 202a can be detected by the detecting portion 212 of the optical detector 210 and displayed by the display portion 214 of the optical detector.

In a typical implementation of the method shown in FIG. 1, each one of the light emitting diodes 202a-202h would be individually tested using the arrangement shown in FIG. 2B and/or other similar types of arrangements. Each test would yield a value for optical power produced by one respective member in the group 200 of light emitting diodes 202a-202h. So that, after the testing was completed, the optical power produced by all of the light emitting diodes would be known. Typically, there would be some degree of variation in the optical power levels of the different light emitting diodes, with all the optical power levels falling within some range of values. As mentioned above, this range of values can include individual optical power levels that vary as much as 300% (or more)—from the low value (e.g., 10.0 milliwatts) in the range to the high value (e.g., 30.0 milliwatts) in the range.

Referring again to FIG. 1, the illustrated method includes (at 110) selecting a target range of optical power levels, within which the optical power level produced by each one of the light emitting diodes 202a-202h in the group 200 should fall. Typically, this target range of optical power levels will be considerably narrower than the actual range of optical power levels that the testing revealed for the group 200 of light emitting diodes 202a-202h. For example, if the actual range of optical power levels that the testing revealed was 300%

(e.g., from a low value of 10.0 milliwatts to a high value of 30.0 milliwatts), the target range of optical power levels might be selected to be about 20% (e.g., from a low value of 10.0 milliwatts to a high value of 12.0 milliwatts, or from a low value of 9.0 milliwatts to a high value of 10.8 milliwatts).

Typically, the target range of optical power levels is selected to ensure that all of the light emitting diodes 202a-202h in the group 200 will be useable and work well in a particular type of end application (e.g., in a smoke detector).

Next, the illustrated method includes selecting a value for electrical resistance to be connected in parallel with at least some of the individual light emitting diodes 202a-202h in the group 200 so that every individual light emitting diode in the group will, when it is connected to an electrical power source, produce an optical power level that falls within the selected target range.

In a typical implementation, two or more of the electrical resistances selected for the light emitting diodes 202a-202h may have different values. For example, the electrical resistance selected for light emitting diode 202a may be 5 ohms, the electrical resistance selected for light emitting diode 202b may be infinite ohms, the electrical resistance selected for light emitting diode 202c may be 70 ohms, the electrical resistance selected for light emitting diode 202d may be 45 ohms, the electrical resistance selected for light emitting diode 202e may be 40 ohms, the electrical resistance selected for light emitting diode 202f may be 10 ohms, the electrical resistance selected for light emitting diode 202g may be 15 ohms, and the electrical resistance selected for light emitting diode 202h may be 25 ohms.

In, some implementations, at least some of the electrical resistances selected for connecting to the light emitting diodes 202a-202h may have the same values. For example, the electrical resistance selected for light emitting diode 202a-202e may be 20 ohms and the electrical resistance selected for light emitting diodes 202f-202h may be infinite ohms.

There are a variety of ways in which the actual values for the electrical resistances may be selected (e.g., calculated).

According to one exemplary technique, the target range of optical power levels would be set to be near (and, perhaps, a bit above) whatever the lowest optical power level that was produced by any of the light emitting diodes in the group during testing.

First, it is noted that, generally speaking, the optical power ($P_o(I)$) produced by a light emitting diodes is a function of the current (I) flowing through the light emitting diode. More particularly, the optical power ($P_o(I)$) produced by a light emitting diodes is directly proportionate to that current (I) at a fixed junction temperature.

$$P_o(I)=\alpha*I, \text{ where } \alpha \text{ is a constant.} \quad \text{(Eq. 1)}$$

Since the target range for optical power, in one example, might be a range that includes the lowest optical power level ($P(I_{Low})$) that was produced by any of the light emitting diodes in the group during the testing, a goal might be to make the optical power produced by one of the other light emitting diodes ($P(I)_N$) match, at least closely, the lowest optical power level ($P_o(I)_{Low}$). This can be expressed as follows:

$$P(I)_N = P(I)_{Low} \quad \text{(Eq. 2)}$$

This goal also can be expressed as follows:

$$\alpha_N * (I)_N = \alpha_{Low} * (I)_{Low} \quad \text{(Eq. 3)}$$

Therefore:

$$(I)_N = (\alpha_{Low}/\alpha_N) * (I)_{Low} \quad \text{(Eq. 4)}$$

where:
- $(I)_N$ is the amount of electrical current that will need to pass through the light emitting diode under consideration to make it produce an optical power level that matches, at least substantially, the optical power level produced by the lowest power light emitting diode in the group during the testing,
- $(I)_{Low}$ is the amount of electrical current that flowed through the light emitting diode that produced the lowest amount of optical power in the group (this may be a quantity that was measured during the test or may be based on the known level of current delivered by the electrical power source during the testing),
- $\alpha_N$ represents the optical power produced per unit of electrical current in the light emitting diode under consideration (this may be based on the optical power measurements and known or measured electrical current delivered during the testing), and
- $\alpha_{Low}$ represents the optical power produced per unit of electrical current by the lowest power light emitting diode in the group (this may be based on the optical power measurements and the known or measured electrical current delivered during the testing).

Figure 3:
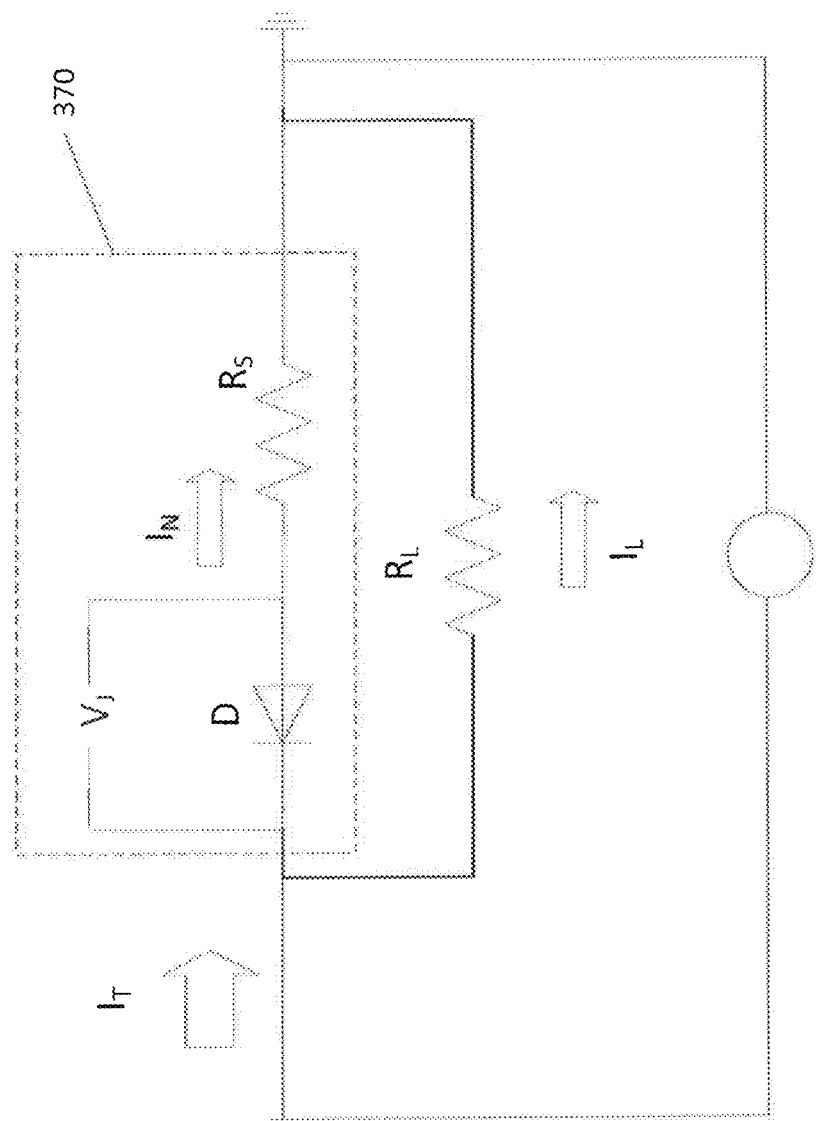
FIG. 3 is a schematic representation of an electrical circuit that includes an electrical power source, a light emitting diode and a parallel connected electrical resistor.

The light emitting diode under consideration with the parallel electrical resistance can be represented by the schematic diagram in FIG. 3. The illustrated diagram models the diode as a light emitting element ("D") and a series (internal) resistance ("Rs"). In this regard, 370 represents a simplified equivalent circuit of a light emitting diode. There is an electrical resistance $R_L$ connected in parallel to the diode. $I_T$ represents the total amount of current being supplied to the diode and its parallel electrical resistance, which is equal to the amount of current that the constant current electrical power source (represented by the circle in the illustrated diagram produces). $I_T$ is divided between the diode and the parallel electrical resistance. $I_N$ represents the portion of $I_T$ that passes through the diode and $I_L$ represents the portion of $I_T$ that passes through the parallel electrical resistor $R_L$. $V_j$ is the voltage drop across the light emitting portion of the diode (i.e., the semiconductor junction in the LED).

The voltage drop across the diode ($V_D$) can be approximated as:

$$V_D = V_j + I_N * R_S \quad \text{(Eq. 5)}$$

The voltage drop ($V_R$) across the parallel electrical resistor $R_L$ is:

$$V_R = I_L * R_L \quad \text{(Eq. 6)}$$

Moreover, $$I_T = I_N + I_L \quad \text{(Eq. 7)}$$

And, $$V_D = V_R \quad \text{(Eq. 8)}$$

$$V_j + I_N * R_S = I_L * R_L \quad \text{(Eq. 9)}$$

The current $I_N$ is set to $(\alpha_{Low}/\alpha_N) * I_T$ which gives $$RL = (V_j + (\alpha_{Low}/\alpha_N) * I_T * R_S)/(I_T * (1 - \alpha_{Low}/\alpha_N)) \quad \text{(Eq. 10)}$$

As an example, if $I_T$=0.1 A, the lowest LED power were 10 mW and $\alpha_{Low}$=0.1 W/A, if, for the light emitting diode under consideration, the LED power were 30 mW and $\alpha_N$=0.3 W/A, if $R_S$=2 ohms and $V_j$=2 volts, then $R_L$=31 ohms.

There may be other ways to select (e.g., calculate or estimate) a parallel electrical resistance for each one of the light emitting diodes as well. For example, in some implementations, the selection technique may include separating the group 200 of light emitting diodes 202a-202h into to two or more bins (e.g., a first bin for the light emitting diodes in the group that produce an optical power at or above a particular threshold value and a second bin for the light emitting diodes in the group that produce an optical power below the particular threshold value). In the case of two bins, the selection technique may include simply designating the same resistance (e.g., 31 ohms) to be applied to (i.e., connected in parallel with) every one of the light emitting diode in the first bin, but to have no resistance applied to the light emitting diodes in the second bin.

Referring again to FIG. 1, the illustrated method includes connecting (at 112) the selected electrical resistances in parallel with their respective corresponding light emitting diodes. Of course, some of the light emitting diodes in the group (e.g., those that already produce an optical power level within the target range) may not receive a parallel electrical resistance. The electrical resistances may be attached to the light emitting diodes in any number of ways. FIGS. 2C1 and 2C2 show two such examples of how the electrical resistances may be connected in parallel with the light emitting diodes 202a-202h in the group 200.

In FIG. 2C1, a discrete electrical resistor 216 is positioned between the leads of each one of light emitting diodes 202a and 202c-202h. In the illustrated example, only one light emitting diode from the group (i.e., 202b) does not have a parallel electrical resistance. The discrete electrical resistors in the illustrated example are rectangular surface mount resistors and are connected to the leads of the light emitting diodes. However, the electrical resistors 216 can be virtually any type of electrical resistor. Moreover, the discrete electrical resistors can be connected using virtually any connection technique including, for example, soldering, using conductive epoxy, etc. In FIG. 2C2, discrete electrical resistor 216 is positioned between the leads of each one of light emitting diodes 202a-202e. In the illustrated example, light emitting diodes 202f-202h do not have a parallel electrical resistance.

Next (at 114), according to the method of FIG. 1, each respective one of the light emitting diodes 202a-202h, with or without a parallel electrical resistance, is installed into an optical detector assemblies. In some implementations, this step (114) may be performed by the same party that performed one or more of steps 102-112. In some implementations, a first party, who performed one or more of steps 102-112, may sell each respective one of the resulting light emitting diodes 202a-202h to a second party and that second party may perform the step shown in 114. An example of installing each respective one of the light emitting diodes 202a-202h, with or without a parallel electrical resistance, into corresponding optical detector assembly is shown in FIG. 2D.

In FIG. 2D, there are eight relatively simple exemplary optical detector assemblies 218 that are substantially identical to each other. Each one has a substrate 220, a corresponding one of the light emitting diodes 202a-202h from (FIG. 2C1) and an optical detector 222. Although the illustrated optical detector assemblies are quite simple, in some implementations, they may be more complex.

In the illustrated example, each light emitting diode 202a-202h is installed in its own, separate optical detector assembly 218. In some implementations, however, two or more light emitting diodes from the same group may be installed into the same optical detector assembly.

Figure 4:
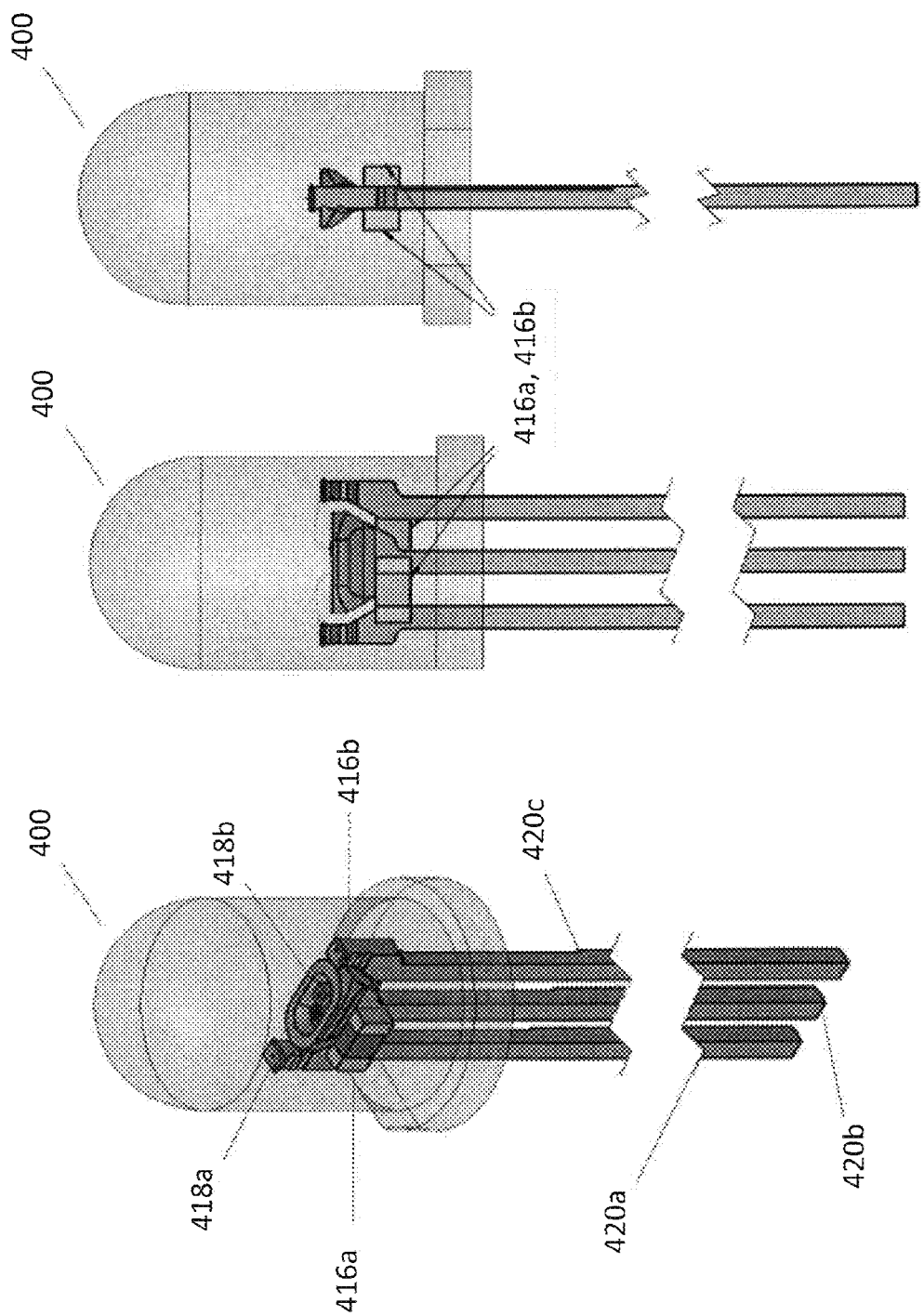
FIG. 4 includes three alternate perspective views of a light emitting diode with parallel connected electrical resistance.
Figure 5:
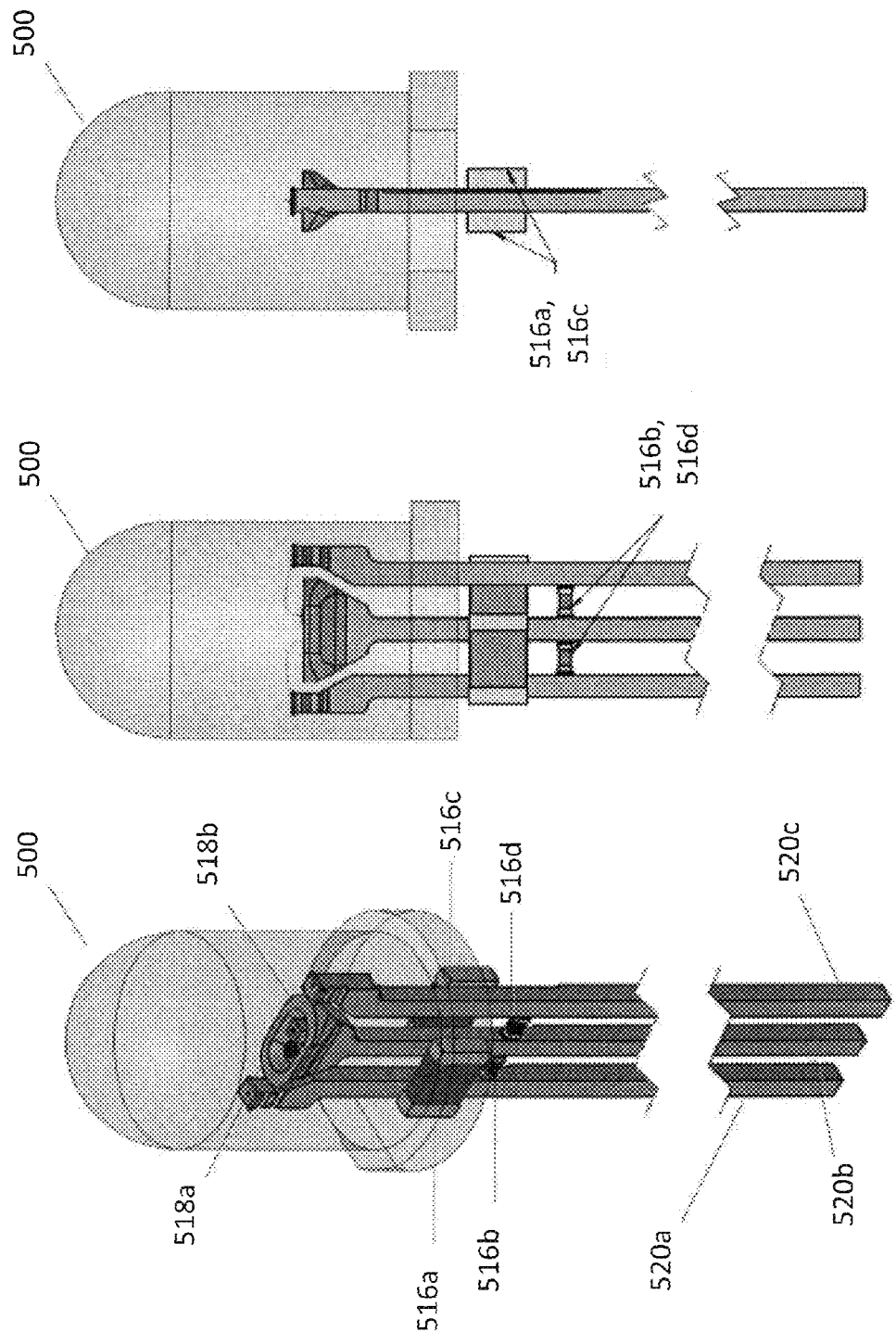
FIG. 5 includes three alternate perspective views of another light emitting diode with parallel connected electrical resistance.
Figure 6:
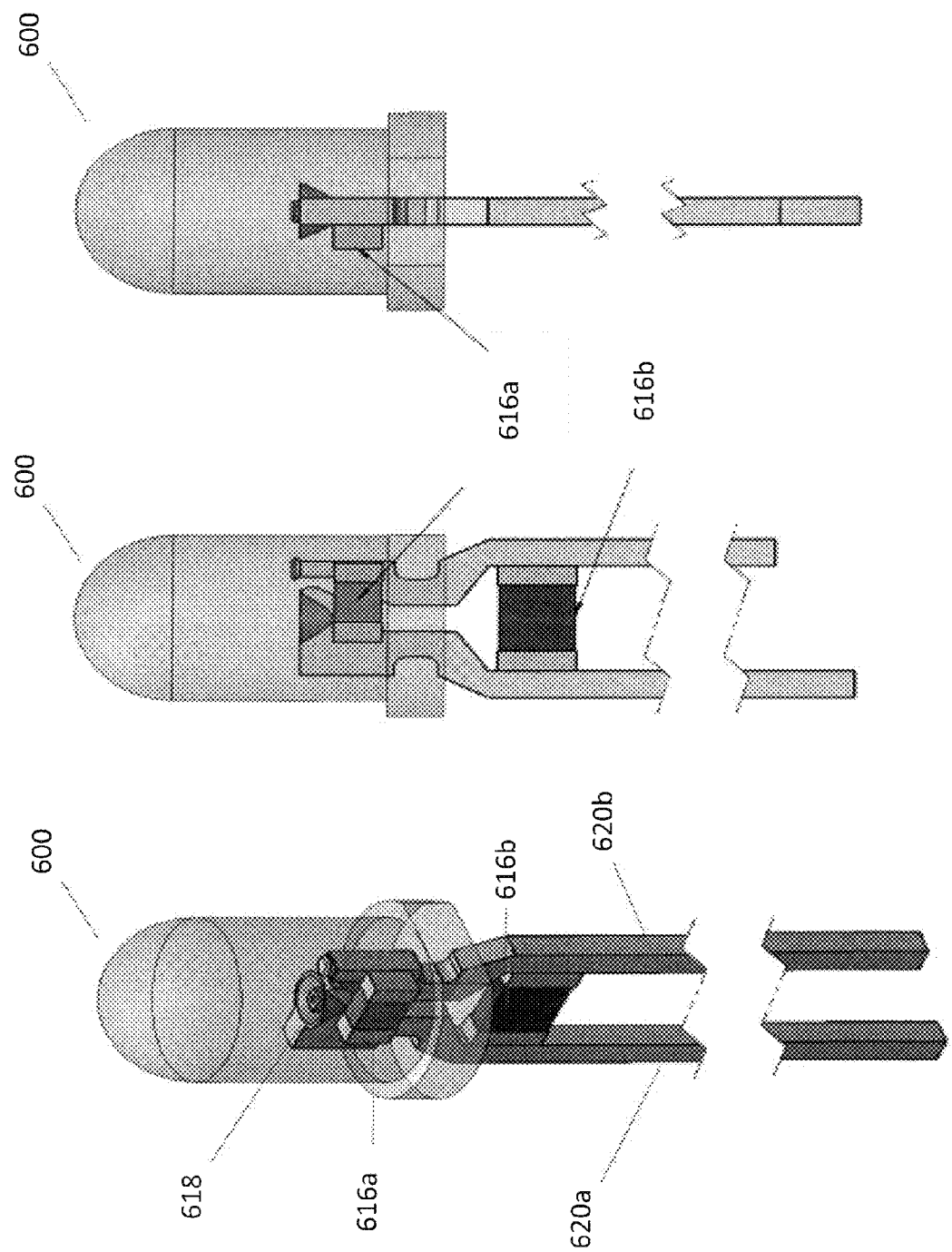
FIG. 6 includes three alternate perspective views of yet another light emitting diode with parallel connected electrical resistance.

FIGS. 4-6 provide additional examples of how electrical resistances may be connected in parallel with a light emitting diode.

FIG. 4, for example, shows different views of a light emitting diode 400 with two separate light emitting elements 418a, 418b and three leads 420a, 420b, 420c. Leads 420a and 420b are for light emitting element 418a, whereas leads 420b and 420c are for light emitting element 418b.

Each light emitting element 418a, 418b has its own parallel electrical resistance 416a, 416b. Electrical resistance 416a is for light emitting element 418a and electrical resistance 416b is for light emitting element 418b.

The electrical resistances 416a, 416b in the illustrated implementation, are positioned within the epoxy lens/case of the light emitting diode 400. In some implementation, electrical resistor 416a has the same resistance value as resistor 416b. However, this is not always the case.

FIG. 5 shows different views of another light emitting diode 500 that has two separate light emitting elements 518a, 518b and three leads 520a, 520b, 520c. Leads 520a and 520b are for light emitting element 518a, whereas leads 520b and 520c are for light emitting element 518b.

Each light emitting element 518a, 518b has its own parallel electrical resistance, embodied as two separate resistors for each light emitting element. For example, light emitting element 518a has two parallel electrical resistors 516a and 516b. Likewise, light emitting element 518b has two parallel electrical resistors 516c, 516d.

The electrical resistances 516a, 516b in the illustrated implementation, are positioned below (and outside) the epoxy lens/case of the light emitting diode 500.

In some implementation, the parallel combination of electrical resistors 516a and 516b provides the same amount of resistance as the parallel combination of electrical resistors 516c, 516d. However, this is not always the case.

In some implementations, the light emitting diode 500 may include only one resistor, instead of two, and that one resistor would extend between the leads of an associated one of the light emitting elements.

FIG. 6 shows different views of yet another light emitting diode 600 that has only one light emitting element 618 and two leads 620a, 620b.

The illustrated light emitting diode 600 has two parallel electrical resistances, embodied as two separate resistors, one 616a inside the epoxy lens/case and one 616b outside the epoxy lens/case.

The electrical resistors 616a and 616b may, but need not, have the same resistance value as each other.

FIG. 7 represents yet another way to connect a parallel electrical resistance to a light emitting diode.

The illustrated arrangement shows a light emitting diode 700 physically coupled to a substrate 750, a discrete electrical resistor 716 also physically coupled to the substrate 750 and a pair of electrically conductive paths 752 in or on the substrate 750 that facilitate electrically coupling the discrete electrical resistor 716 to the light emitting diodes 700.

A number of embodiments of the invention have been described. Nevertheless, it will be understood that various modifications may be made without departing from the spirit and scope of the invention.

For example, in general, the more resistor values available, the tighter the final distribution of output powers can be made. However, there may be cases where, as an example, it is desired to end up with an output power distribution less than, say, 12% wide. If $P_{low}$ is the output power of the lowest output power light emitting diode, it may be possible to choose the resistors to get the final distribution from 2% lower than $P_{low}$ 10% higher than $P_{low}$. In some cases, this might actually allow the use of fewer resistor values than targeting the lowest value $P_{low}$. It might also allow use of more of the production distribution.

Specifically, for example, suppose the output power distribution went from 10 mW to 30 mW. One way to collapse the distribution may be to target a range of 10 mW to 12 mW to produce a 20% wide distribution, then to target all the other light emitting diodes to be within this range. This allows to final distribution to be ~10% higher average value than if the target had been 10 mW +/−10%.

Another possible modification relates to the method of testing the light emitting diodes (pre-adding resistors) to determine their optical power levels. The exemplary arrangement for conducting these tests shown in FIG. 2 has only a single one of the light emitting diodes 202 is connected to the electrical power source 206. However, in other implementations, more than one light emitting diode 202 may be connected, in series, in parallel or combination thereof, to the electrical power source 206 at one particular time. If more than one light emitting diode 202 is connected to the electrical power source 206 at the same time, then means may be provided to facilitate accurately measuring the light produced from each respective one of the light emitting diodes individually. Such provisions may include, for example, one or more switches configured to selectively turn on one of the light emitting diodes at a time and/or physical shutters to optically isolate the light produced by respective ones of the individual light emitting diodes relative to the other light emitting diodes. In some implementations, there may be an optical detector for each light emitting diode with all of the light emitting diodes in the group operating at once.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting or being implemented in certain combinations and even initially claimed as such, one or more features from a claimed combination can in some cases be excised from the combination, and the claimed combination may be directed to a subcombination or variation of a subcombination.

Similarly, while operations are depicted in the drawings and described herein as occurring in a particular order, this should not be understood as requiring that such operations be performed in the particular order shown or in sequential order, or that all illustrated operations be performed, to achieve desirable results. In certain circumstances, multitasking and performing certain operations in parallel may be advantageous.

The concept of optical power should be understood broadly to include virtually any kind of representation or indicator of optical power produced by a light emitting diode.

Moreover, the concepts described herein may be applied to lasers and even detectors that produce current that is proportional to light input.

Relative terms, such as "lower," "upper," "horizontal," "vertical,", "above", "below", "up", "down", "top" and "bottom" as well as derivative thereof (e.g., "horizontally," "downwardly," "upwardly," etc.), to the extent they may be used herein should be construed to apply only to certain orientations (e.g., a particular orientation being described or shown in a drawing being discussed). These relative terms are used for convenience only and do not require that the apparatus be constructed or operated in a particular orientation.

Other implementations are within the scope of the claims.

What is claimed is:

1. A method comprising:
   providing a group of discrete light emitting diodes;
   testing each respective one of the light emitting diodes in the group to determine an optical power level produced by that light emitting diode when connected to an electrical power source,
   wherein the electrical power source delivers a substantially identical amount of electrical current to each respective one of the light emitting diodes during the testing, and
   wherein all of the optical power levels produced by the light emitting diodes when connected to the electrical power source fall within a first range; and
   connecting an electrical resistance in parallel with at least some of the light emitting diodes in the group to reduce an amount of optical power produced by those light emitting diodes,
   wherein, after the electrical resistances are connected, all of the optical power levels produced by the light emitting diodes fall within a second range that is narrower than the first range.

2. The method of claim 1, wherein testing each respective one of the light emitting diodes in the group comprises:
   connecting each light emitting diode to the electrical power source individually without any of the other light emitting diodes; and
   measuring how much optical power that light emitting diode produces when connected to the electrical power source.

3. The method of claim 2, wherein the electrical power source is a constant current electrical power source.

4. The method of claim 3, wherein the constant current electrical source is either a constant direct current source of electricity or a pulsed source of electricity that maintains a constant current level for discrete periods of time.

5. The method of claim 1, wherein connecting the electrical resistances comprises:
   connecting electrical resistors having at least two different values to the light emitting diodes.

6. The method of claim 1, wherein connecting the electrical resistances comprises:
   separating the group of light emitting diodes into a first sub-group and a second sub-group;
   connecting an electrical resistance to each of the light emitting diodes in the first subgroup; but
   not connecting any of the electrical resistances to the light emitting diodes in the second sub-group.

7. The method of claim 1, wherein at least some of the light emitting diodes do not receive any of the electrical resistances.

8. The method of claim 1, wherein connecting one or more of the electrical resistances comprises:
   physically attaching a discrete electrical resistor directly to leads of each corresponding one of the light emitting diodes.

9. The method of claim 1, wherein connecting one or more of the electrical resistances comprises:
   physically attaching a discrete electrical resistor to a substrate; and
   physically attaching a corresponding one of the light emitting diodes to the substrate, wherein one or more conductive paths in or on the substrate facilitates an electrical coupling between the discrete electrical resistor and the corresponding one of the light emitting diodes.

10. The method of claim 1, further comprising:
for each one of one or more of the light emitting diodes that receives a parallel electrical resistance, calculating a value for the parallel electrical resistance,
wherein the calculated value results in that light emitting diode producing an optical power level when connected to the electrical power source that falls within the second range.

11. The method of claim 1, further comprising:
after connecting the electrical resistances, associating each one of the light emitting diodes in the group with an optical detector.

12. The method of claim 1, wherein the all of the optical detectors are configured to detect optical power levels in the second range.

13. The method of claim 1, wherein the first range has a lowest value and an upper value, wherein the second range has a lowest value and an upper value, and
wherein the lowest value of the second range is lower than the lowest value of the first range.

14. A method comprising:
determining an optical power level produced by each respective one of a group of light emitting diodes when the light emitting diode is connected to a constant current electrical power source, wherein all of the optical power levels fall within a first range; and
connecting an electrical resistance in parallel with at least some of the light emitting diodes in the group to reduce an amount of optical power produced by those light emitting diodes so that, after the electrical resistances are connected, all of the optical power levels produced by the light emitting diodes when connected to the constant current electrical power source fall within a second range that is narrower than the first range.

15. The method of claim 14, wherein the constant current electrical power source is adapted to deliver a substantially identical amount of electrical current to each respective one of the light emitting diodes to determine the optical power level produced by each respective light emitting diode of the group.

16. The method of claim 14, wherein determining the optical power level produced by each respective light emitting diode comprises:
connecting each light emitting diode to the electrical power source individually without any of the other light emitting diodes.

17. The method of claim 14, wherein at least one of the electrical resistances has a different value than at least one other of the electrical resistances.

18. The method of claim 14, wherein at least some of the light emitting diodes from the group do not receive any of the electrical resistances.

19. The method of claim 14, wherein connecting the electrical resistances comprises:
separating the group of light emitting diodes into a first sub-group and a second sub-group;
connecting an electrical resistance in parallel with each one of the light emitting diodes in the first subgroup; and
not connecting any of the electrical resistances in parallel with the light emitting diodes in the second sub-group.

20. The method of claim 14, further comprising: prior to connecting the electrical resistances, for each one of one or more of the light emitting diodes:
calculating a value for the electrical resistance to be connected in parallel with that light emitting diode, wherein the calculated value results in that light emitting diode producing an optical power level within the second range when connected to the electrical power source.

* * * * *